United States Patent
Zeng et al.

(10) Patent No.: US 10,802,913 B1
(45) Date of Patent: ＊Oct. 13, 2020

(54) SOLID STATE STORAGE DEVICE USING PREDICTION FUNCTION

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Tsu-Han Lu, Taipei (TW); Hsiao-Chang Yen, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,620

(22) Filed: Jul. 25, 2019

(30) Foreign Application Priority Data

May 23, 2019 (CN) .......................... 2019 1 0436830

(51) Int. Cl.
*G06F 11/00* (2006.01)
*G06F 11/10* (2006.01)
*G11C 29/52* (2006.01)
*G06F 3/06* (2006.01)

(52) U.S. Cl.
CPC ........ *G06F 11/1068* (2013.01); *G06F 3/0604* (2013.01); *G06F 3/0659* (2013.01); *G06F 3/0679* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 9,922,706 B2 | 3/2018 | Zeng et al. | |
| 2006/0168500 A1* | 7/2006 | Whinnett | H04L 1/005 714/794 |
| 2007/0291388 A1* | 12/2007 | Yoshida | G11B 27/36 360/31 |
| 2008/0040818 A1* | 2/2008 | Iima | G06F 8/65 726/36 |
| 2012/0089885 A1* | 4/2012 | Grube | G06F 16/182 714/752 |
| 2013/0024605 A1* | 1/2013 | Sharon | G06F 11/1044 711/103 |

* cited by examiner

*Primary Examiner* — Mujtaba M Chaudry
(74) *Attorney, Agent, or Firm* — WPAT, PC (57) ABSTRACT

A solid state storage device using a prediction function is provided. The solid state storage device includes a control circuit and a non-volatile memory. The control circuit generates collection read operation commands. The collection read operation commands are temporarily stored in a command queue, and transmitted to the non-volatile memory. According to each of the collection read operation commands, the non-volatile memory generates a corresponding encoded read data to the control circuit. After the error correction circuit performs a decoding operation on the encoded read data, a decoded content is generated and a first count of the decoded content is transmitted to a first register of the register set. After the encoded read data is decoded, a value stored in the first register is a first parameter and the first parameter is inputted into a prediction function of the function storage circuit.

11 Claims, 7 Drawing Sheets

| Index | Type | Reset enable | Collection enable |
|---|---|---|---|
| 1 | Collection read operation | 1 | 1 |
| 2 | Collection read operation | 0 | 1 |
| 3 | Host read operation | 0 | 0 |
| 4 | Host read operation | 0 | 0 |
| 5 | Host read operation | 0 | 0 |
| 6 | Host read operation | 0 | 0 |
| 7 | Collection read operation | 0 | 1 |
| ... | ... | ... | ... |

328

330a: xxxx, 0038, 0074, 0074, 0074, 0074, 0074, 0105, ...

Register a: error bit count
Register b: error bit variance
Register c: decode fail count
Register d: busy time
Register e: ECC codeword count

| Index | Type | Reset enable | Collection enable | Register selection |
|---|---|---|---|---|
| 1 | Collection read operation | 1 | 1 | 11001 |
| 2 | Collection read operation | 0 | 1 | 11001 |
| 3 | Host read operation | 0 | 0 | 0 |
| 4 | Host read operation | 0 | 0 | 0 |
| 5 | Host read operation | 0 | 0 | 0 |
| 6 | Host read operation | 0 | 0 | 0 |
| 7 | Collection read operation | 0 | 1 | 11001 |
| ... | ... | ... | ... | ... |

| Index | Type | Reset enable | Collection enable | Register selection | Collection end |
|---|---|---|---|---|---|
| 1 | Collection read operation | 1 | 1 | 11001 | 0 |
| 2 | Collection read operation | 0 | 1 | 11001 | 0 |
| 3 | Host read operation | 0 | 0 | 0 | 0 |
| 4 | Host read operation | 0 | 0 | 0 | 0 |
| 5 | Host read operation | 0 | 0 | 0 | 0 |
| 6 | Host read operation | 0 | 0 | 0 | 0 |
| 7 | Collection read operation | 0 | 1 | 11001 | 0 |
| ... | ... | ... | ... | ... | ... |
| 5000 | Collection read operation | 0 | 1 | 11001 | 1 |

Register a: error bit count
Register b: error bit variance
Register c: decode fail count
Register d: busy time
Register e: ECC codeword count

FIG. 7

| Index | Type | Reset enable | Collection enable | Register selection | Group selection |
|---|---|---|---|---|---|
| 1 | Collection read operation | 1 | 1 | 11001 | 10 |
| 2 | Collection read operation | 0 | 1 | 11001 | 10 |
| 3 | Host read operation | 0 | 0 | 0 | 0 |
| 4 | Host read operation | 0 | 0 | 0 | 0 |
| 5 | Host read operation | 0 | 0 | 0 | 0 |
| 6 | Host read operation | 0 | 0 | 0 | 0 |
| 7 | Collection read operation | 0 | 1 | 11001 | 10 |
| ... | ... | ... | ... | ... | ... |

328

(00) Register a0: error bit count
Register b0: error bit variance
Register c0: decode fail count
Register d0: busy time
Register e0: ECC codeword count (01) Register a1: error bit count
Register b1: error bit variance
Register c1: decode fail count
Register d1: busy time
Register e1: ECC codeword count (10) Register a2: error bit count
Register b2: error bit variance
Register c2: decode fail count
Register d2: busy time
Register e2: ECC codeword count (11) Register a3: error bit count
Register b3: error bit variance
Register c3: decode fail count
Register d3: busy time
Register e3: ECC codeword count

FIG. 8

SOLID STATE STORAGE DEVICE USING PREDICTION FUNCTION

This application claims the benefit of People's Republic of China Patent Application No. 201910436830.1, filed May 23, 2019, the subject matter of which is incorporated herein by reference.

FIELD OF THE INVENTION

The present invention relates to a solid state storage device, and more particularly to a solid state storage device using a prediction function.

BACKGROUND OF THE INVENTION

As is well known, solid state storage devices such as SD cards or solid state drives (SSD) are widely used in various electronic devices. Generally, a solid state storage device comprises a non-volatile memory. After data are written to the non-volatile memory, if no electric power is supplied to the solid state storage device, the data are still retained in the non-volatile memory.

U.S. Pat. No. 9,922,706 discloses a solid state storage device using a state prediction method. The state prediction method uses a prediction function to predict the state of the non-volatile memory of the solid state storage device in the further time, predict the suitable decoding process or provide the suitable read voltage.

Figures 1, 2:
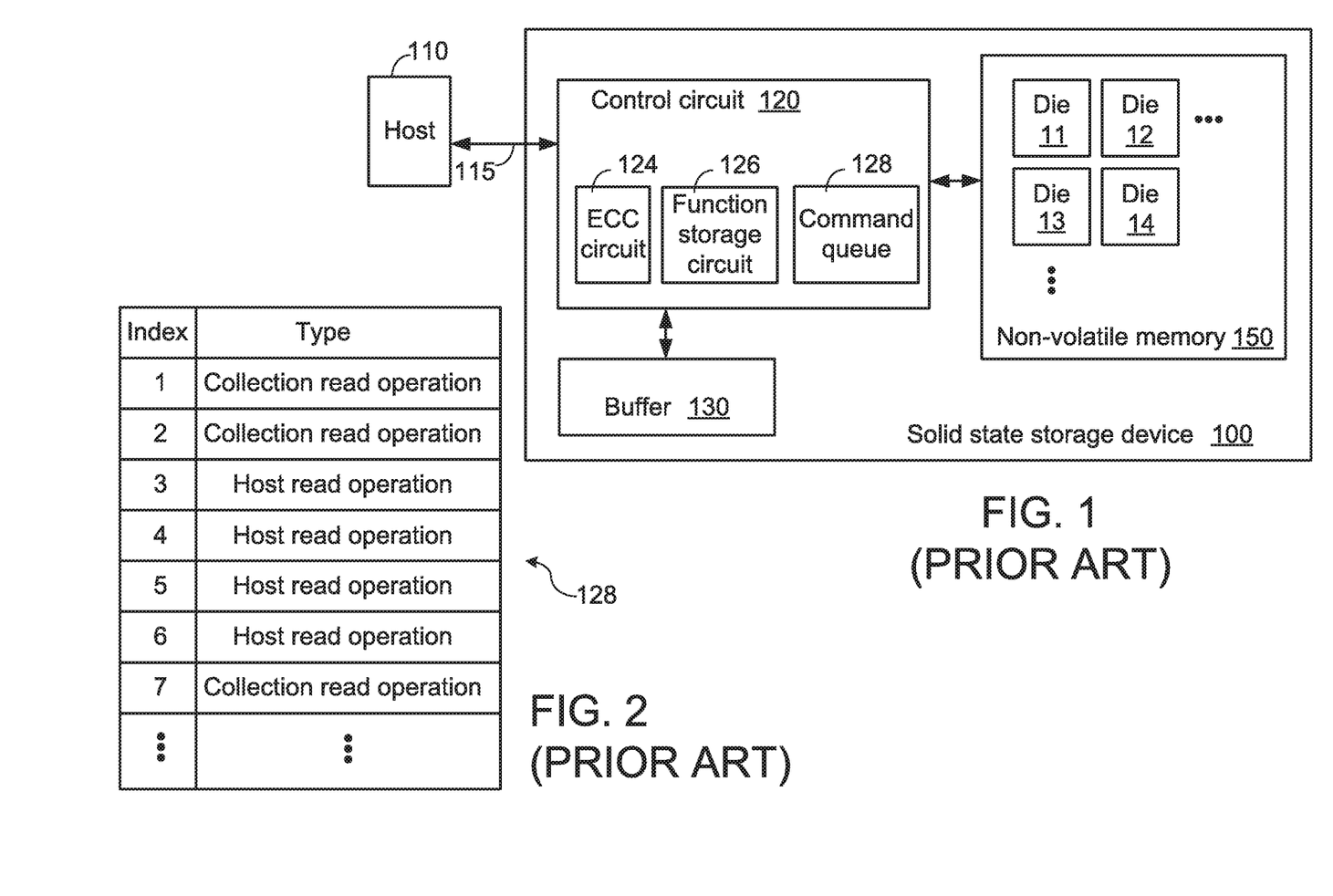
FIG. 1 (prior art) is a schematic functional block diagram illustrating the architecture of a conventional solid state storage device.
FIG. 2 (prior art) schematically illustrates the contents of a conventional command queue.

FIG. 1 is a schematic functional block diagram illustrating the architecture of a conventional solid state storage device. As shown in FIG. 1, the solid state storage device 100 is connected with a host 110 through an external bus 115. For example, the external bus 115 is an USB bus, a SATA bus, a PCIe bus, a M.2 bus, an U.2 bus, or the like.

The solid state storage device 100 comprises a control circuit 120, a buffer 130 and a non-volatile memory 150. The control circuit 120 is connected with the non-volatile memory 150 and the buffer 130. The non-volatile memory 150 comprises plural dies 11~14. For example, the plural dies 11~14 are NAND flash dies. The buffer 130 is a dynamic random access memory (DRAM).

The control circuit 120 further comprises an error correction (ECC) circuit 124, a function storage circuit 126 and a command queue 128. Moreover, plural operation commands are temporarily stored in the command queue 128. For example, the operation commands include a program operation command, a read operation command and an erase operation command. Moreover, the operation commands in the command queue 128 can be transmitted to the non-volatile memory 150 by the control circuit 120.

When the host 110 issues a write command and a write data, the control circuit 120 generates a program operation command according to the write command and temporarily stores the program operation command into the command queue 128. After the ECC circuit 124 performs an ECC encoding operation on the write data, the write data is converted into an encoded write data. The encoded write data is temporarily stored in the buffer 130. Then, the program operation command and the encoded write data are transmitted from the control circuit 120 to the non-volatile memory 150. Consequently, the encoded write data is stored in the non-volatile memory 150.

When the host 110 issues a read command, the control circuit 120 generates a read operation command according to the read command and temporarily stores the read operation command into the command queue 128. After the read operation command is transmitted from the control circuit 120 to the non-volatile memory 150, the non-volatile memory 150 issues an encoded read data to the control circuit 120. After the ECC circuit 124 performs a decoding operation on the encoded read data, a read data is generated and temporarily stored into the buffer 130. Then, the read data is transmitted to the host 110.

Generally, the control circuit 120 executes the program operation command to store the encoded write data into a specified die of the dies 11~14, or the control circuit 120 distributes the encoded write data to all dies 11~14. Alternatively, the control circuit 120 executes the read operation command to acquire the encoded read data from a specified die of the dies 11~14 or from all dies 11~14.

Moreover, the control circuit 120 generates the erase operation command at the proper time and temporarily stores the erase operation command into the command queue 128. After the erase operation command is transmitted to the non-volatile memory 150, a specified block of a specified die of the dies 11~14 in the non-volatile memory 150 is erased or the data in specified blocks of all dies 11~14 are erased.

After the solid state storage device 100 leaves the factory, if the non-volatile memory 150 has been programmed, read and erased many times, the characteristics of the non-volatile memory 150 are deteriorated. Consequently, the data loss problem possibly occurs. When the encoded read data from the non-volatile memory 150 could not be successfully decoded, the accurate read data cannot be generated to the host. Under this circumstance, a read failure problem occurs.

For overcoming the read failure problem of the solid state storage device 10, plural prediction functions are stored in the function storage circuit 126 of the control circuit 120. The prediction functions can predict the state of the non-volatile memory 150 in a future time (e.g., after three days, one week or one month) according to various parameters of the non-volatile memory 150. If the prediction functions judge that the state of the non-volatile memory 150 in the future time possibly influences the performance of the solid state storage device 100, the control circuit 120 can perform the correction in advance. For example, the control circuit 120 may modify the decoding process of the decoding operation, changing the read voltage, or moving the data of the possibly-damaged block to another block according to the prediction result.

After the solid state storage device 100 leaves the factory and during the operation of the solid state storage device 100, the control circuit 120 continuously collects plural parameters of the blocks of the non-volatile memory 150. Moreover, the plural parameters are inputted into the prediction functions, and thus the corresponding prediction results are acquired. The parameters of the non-volatile memory 150 includes the error bit count, the program time, the erase time, the current decoding process (e.g., the hard decoding process or the soft decoding process), the operating temperature of the non-volatile memory 150, the read voltage shift, and so on.

For collecting the parameters of the non-volatile memory 150, the control circuit 120 generates the read operation command by itself and temporarily stores the read operation command into the command queue 128. After the encoded read data is transmitted from the non-volatile memory 150 to the control circuit 120 according to the read operation command, the ECC circuit 124 performs a decoding operation on the encoded read data. While the decoding operation is performed, the decoding contents are temporarily stored in the buffer 130. After the control circuit 120 reads all decoded contents from the buffer 130, the control circuit 120 calculates the parameters for the prediction functions. After the calculated parameters are inputted into the prediction functions, the control circuit 120 acquires the prediction results. The decoded contents include the error bit count, the program time, the erase time, the current decoding process, the operating temperature, and so on.

FIG. 2 schematically illustrates the contents of a conventional command queue. According to the read command from the host 110, the control circuit 120 generates a corresponding host read operation command and temporarily stores the host read operation command into the command queue 128. For collecting the information of the non-volatile memory 150, the control circuit 120 generates a collection read operation command and temporarily stores the collection read operation command into the command queue 128.

Generally, the read operation commands are not sequentially transmitted from the control circuit 120 to the non-volatile memory 150. According to the results of judging whether the dies 11~14 are in the busy state or not, the read operation commands are transmitted from the control circuit 120 to the non-volatile memory 150 in an out-of-order manner. For example, if the die 11 is in the busy state, the read operation command corresponding to the die 11 is not transmitted from the control circuit 120 to the non-volatile memory 150. If the die 13 is not busy (i.e., in an idle state), the read operation command corresponding to the die 13 is transmitted from the command queue 128 of the control circuit 120 to the non-volatile memory 150. Similarly, the program operation command and the erase operation command can be temporarily stored in the command queue 128.

Since the read operation commands are transmitted from the control circuit 120 to the non-volatile memory 150 in the out-of-order manner, the control circuit 120 has to judge whether the returned content from the non-volatile memory 150 is the encoded read data corresponding to the host read operation command or the encoded read data corresponding to the collection read operation command. After the decoding operation is performed and the read data is generated, the read data corresponding to the host read operation command is transmitted to the host 100.

Moreover, the read data corresponding to the collection read operation command does not need to be transmitted to the host 100. While the decoding operation is performed by the control circuit 120, the decoded content is temporarily stored in the buffer 130.

For example, one block of the non-volatile memory 150 has 1024 pages. Each page contains 4 ECC codewords. For collecting the decoded content of one block, the control circuit 120 has to issue 4096 (=1024×4) collection read operation commands to the command queue 128. Moreover, the 4096 collection read operation commands are transmitted to the non-volatile memory 150 to read 4096 ECC codewords. After one ECC codeword is decoded, the decoded content with 4 bytes is generated. In other words, the control circuit 120 receives the decoded content with 16384 (=4096×4) bytes and temporarily stores the decoded content into the buffer 130.

For predicting the state of one block, the control circuit 120 has to set 16384-byte space to temporarily store the decoded content. If the control circuit 120 intends to predict the states of plural blocks, a lot of space in the buffer 130 is occupied.

Moreover, the control circuit 120 has to frequently read the decoded content in the buffer 130, and calculate the parameters for the prediction functions. Consequently, the overall performance of the solid state storage device 100 is deteriorated.

SUMMARY OF THE INVENTION

An embodiment of the present invention provides a solid state storage device. The solid state storage device includes a non-volatile memory, a buffer and a control circuit. The non-volatile memory includes plural dies. The control circuit is connected with the non-volatile memory and the buffer. The control circuit includes an error correction circuit, a function storage circuit, a register set and a command queue. Moreover, plural collection read operation commands are generated by the control circuit, temporarily stored in the command queue, and transmitted to the non-volatile memory. According to each of the collection read operation commands, the non-volatile memory generates a corresponding encoded read data to the control circuit. After the error correction circuit performs a decoding operation on the encoded read data, a decoded content is generated and a first count of the decoded content is transmitted to a first register of the register set. After the encoded read data is decoded, a value stored in the first register is a first parameter and the first parameter is inputted into a prediction function of the function storage circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As mentioned above, the control circuit has to calculate the parameters for the prediction functions, and thus the overall performance of the solid state storage device is deteriorated. For solving the above drawbacks, the present invention provides an improved solid state storage device. In the solid state storage device of the present invention, the read operation command contains plural setting fields to control the operations of the corresponding registers.

Figure 3:
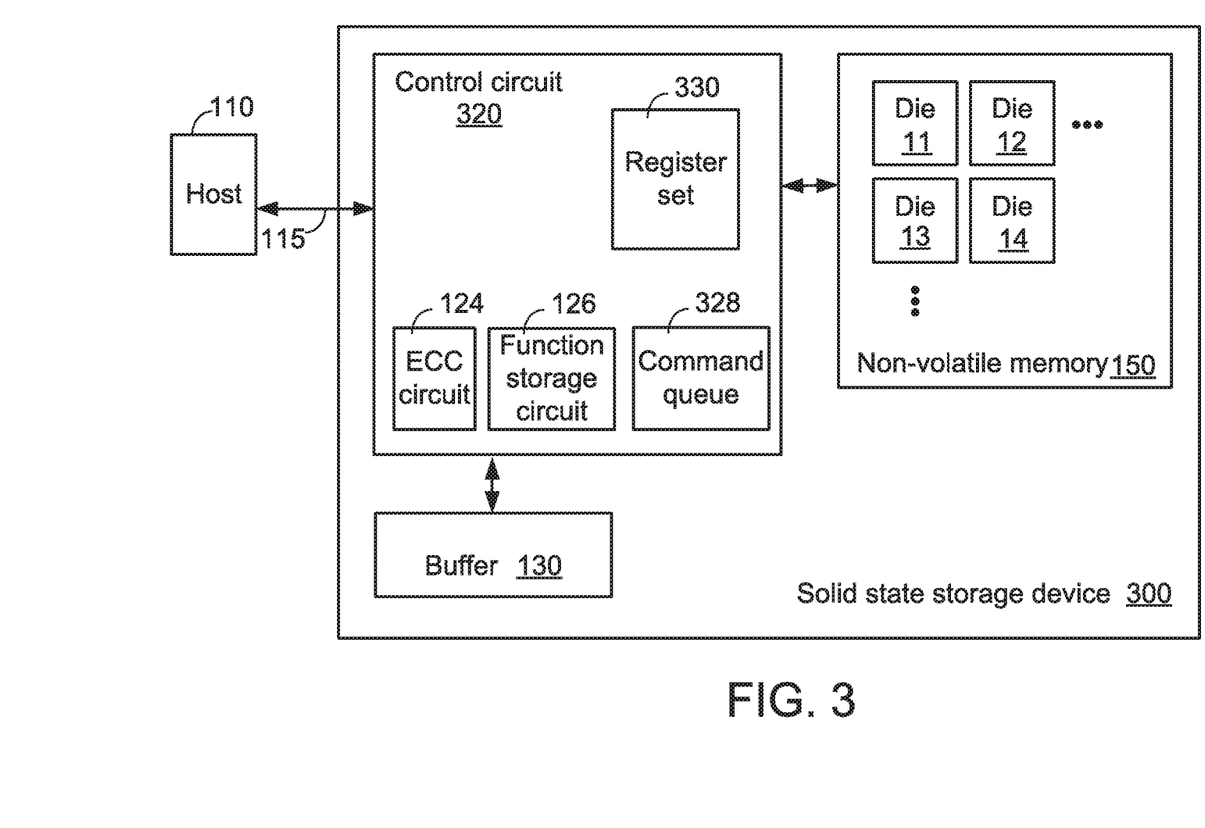
FIG. 3 is a schematic functional block diagram illustrating the architecture of a solid state storage device according to an embodiment of the present invention.

FIG. 3 is a schematic functional block diagram illustrating the architecture of a solid state storage device according to an embodiment of the present invention. As shown in FIG. 3, the solid state storage device 300 is connected with a host 110 through an external bus 115. For example, the external bus 115 is an USB bus, a SATA bus, a PCIe bus, a M.2 bus, an U.2 bus, or the like.

The solid state storage device 300 comprises a control circuit 320, a buffer 130 and a non-volatile memory 150. The control circuit 320 is connected with the non-volatile memory 150 and the buffer 130. The non-volatile memory 150 comprises plural dies 11~14. For example, the plural dies 11~14 are NAND flash dies. The buffer 130 is a dynamic random access memory (DRAM).

The control circuit 320 further comprises a register set 330, an error correction (ECC) circuit 124, a function storage circuit 126 and a command queue 328. Moreover, plural operation commands are temporarily stored in the command queue 328. For example, the operation commands include a program operation command, a read operation command and an erase operation command. Moreover, the operation commands in the command queue 328 can be transmitted to the non-volatile memory 150 by the control circuit 320.

Similarly, when the host 110 issues a write command or a read command, the control circuit 320 generates a program operation command or a read operation command. The program operation command or the read operation command is temporarily stored in the command queue 328. The program operation command or the read operation command can be transmitted from the command queue 328 to the non-volatile memory 150 by the control circuit 320. The associated operations are not redundantly described herein.

Generally, the control circuit 320 executes the program operation command to store the encoded write data into a specified die of the dies 11~14, or the control circuit 320 distributes the encoded write data to all dies 11~14. Alternatively, the control circuit 320 executes the read operation command to acquire the encoded read data from a specified die of the dies 11~14 or from all dies 11~14.

Moreover, the control circuit 320 generates the erase operation command at the proper time and temporarily stores the erase operation command into the command queue 328. After the erase operation command is transmitted to the non-volatile memory 150, a specified block of a specified die of the dies 11~14 in the non-volatile memory 150 is erased or the data in specified blocks of all dies 11~14 are erased.

After the solid state storage device 300 leaves the factory and during the operation of the solid state storage device 300, the control circuit 320 continuously collects plural parameters of the blocks of the non-volatile memory 150. Moreover, the plural parameters are inputted into the prediction functions, and thus the corresponding prediction results are acquired. The parameters of the non-volatile memory 150 includes the error bit count, the program time, the erase time, the current decoding process (e.g., the hard decoding process or the soft decoding process), the operating temperature of the non-volatile memory 150, the read voltage shift, and so on.

In accordance with the present invention, the read operation command generated by the control circuit 320 additionally contains plural setting fields. Moreover, at least one register of the register set 330 is employed to continuously record the decoded content, by the way, the contents of the register can be paused or reset.

Figure 4:
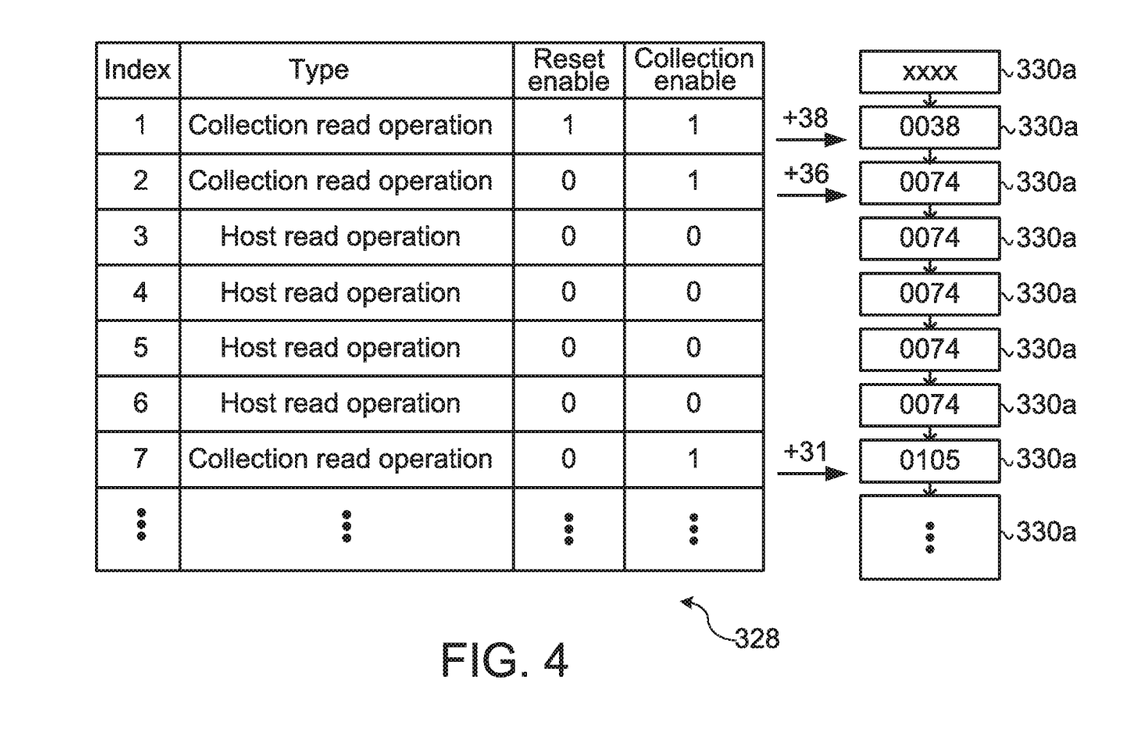
FIG. 4 schematically illustrates the operating relationship between the read operation commands in the command queue and the register of the control circuit according to a first embodiment of the present invention.

FIG. 4 schematically illustrates the operating relationship between the read operation commands in the command queue and the register of the control circuit according to a first embodiment of the present invention. According to the read command from the host 110, the control circuit 320 generates a corresponding host read operation command and temporarily stores the host read operation command into the command queue 328. For collecting the information of the non-volatile memory 150, the control circuit 320 generates a collection read operation command and temporarily stores the collection read operation command into the command queue 328.

As shown in FIG. 4, the read operation command generated by the control circuit 320 contains two bits. These two bits denote a reset enabling field and a collection enabling field. In the following examples, the bit "1" in each of the reset enabling field and the collection enabling field indicates the enabling situation and the bit "0" in each of the reset enabling field and the collection enabling field indicates the disabled situation. In some other embodiment, the bit "0" in each of the reset enabling field and the collection enabling field indicates the enabling situation and the bit "1" in each of the reset enabling field and the collection enabling field indicates the disabled situation.

For example, if an error bit count of a specified block is used as a parameter of the non-volatile memory 150 and inputted into the prediction function, the control circuit 320 uses an accumulator resistor 330a of the register set 330 to acquire the error bit count. The process of acquiring the error bit count will be described as follows.

For example, one block of the non-volatile memory 150 has 1024 pages. Each page contains 4 ECC codewords. For collecting the total error bit count of one block, the control circuit 320 has to issue 4096 (=1024×4) collection read operation commands to the command queue 328. Moreover, the 4096 collection read operation commands are transmitted to the non-volatile memory 150 to read 4096 ECC codewords.

As shown in FIG. 4, the command queue 328 contains collection read operation commands and host read operation commands. In the collection read operation command corresponding to the index 1, the reset enabling field is "1" and the collection enabling field is "1". Under this circumstance, the accumulator resistor 330a is reset and the error bit count is accumulated. According to the collection read operation command corresponding to the index 1, the ECC circuit 124 performs the decoding action on the ECC codeword from the non-volatile memory 150. After the ECC codeword is decoded, the decoded content containing 38 bits are recorded in the accumulator resistor 330a. Meanwhile, the value recorded in the accumulator resistor 330a now becomes 38.

In the collection read operation command corresponding to the index 2, the reset enabling field is "0" and the collection enabling field is "1". Under this circumstance, the accumulator resistor 330a is not reset but the error bit count is continuously accumulated. According to the collection read operation command corresponding to the index 2, the ECC circuit 124 performs the decoding action on the ECC codeword from the non-volatile memory 150. After the ECC codeword is decoded, the decoded content containing 36 bits are recorded in the accumulator resistor 330a. Meanwhile, the value recorded in the accumulator resistor 330a now becomes 74.

In the host read operation command corresponding to the index 3, the reset enabling field is "0" and the collection enabling field is "0". Under this circumstance, the accumulator resistor 330a is not reset and the error bit count is not accumulated. According to the host read operation command corresponding to the index 3, the ECC circuit 124 performs the decoding action on the ECC codeword from the non-volatile memory 150. After the ECC codeword is decoded, the error bits contained in the decoded content are not accumulated in the accumulator resistor 330a. Meanwhile, the value recorded in the accumulator resistor 330a is maintained at 74. Similarly, according to the host read operation commands corresponding to the index 4, the index 5 and the index 6, the value recorded in the accumulator resistor 330a is maintained at 74.

In the collection read operation command corresponding to the index 7, the reset enabling field is "0" and the collection enabling field is "1". Under this circumstance, the accumulator resistor 330a is not reset but the error bit count is continuously accumulated. According to the collection read operation command corresponding to the index 7, the ECC circuit 124 performs the decoding action on the ECC codeword from the non-volatile memory 150. After the ECC codeword is decoded, the decoded content containing 31 bits are recorded in the accumulator resistor 330a. Meanwhile, the value recorded in the accumulator resistor 330a now becomes 105.

The rest may be deduced by analogy. After the 4096 collection read operation commands generated by the control circuit 320 are transmitted from the command queue 328 to the non-volatile memory 150, the value recorded in the accumulator resistor 330a is the total error bit count of the specified block. Meanwhile, the value of the accumulator resistor 330a is directly read by the control circuit 320 and used as a parameter to be inputted into the prediction function.

Figure 5:
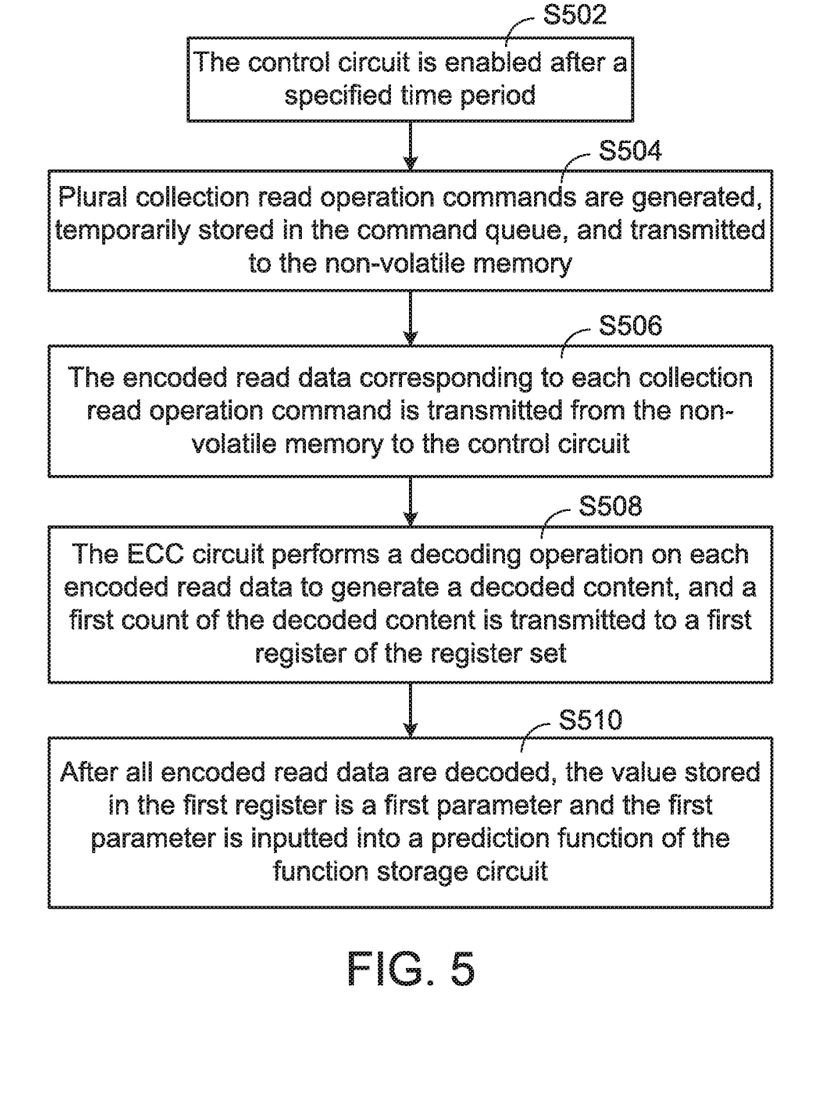
FIG. 5 is a flowchart illustrating a parameter calculating process for the solid state storage device according to the first embodiment of the present invention.

FIG. 5 is a flowchart illustrating a parameter calculating process for the solid state storage device according to the first embodiment of the present invention. Firstly, the control circuit 320 is enabled after a specified time period (Step S502). For example, the specified time period is 10 hours or 1 day. In case that the specified time period is 10 hours, the control circuit 320 uses the prediction function to predict the state of the non-volatile memory 150 after the solid state storage device has been operated for 10 hours.

The, plural collection read operation commands are generated, temporarily stored in the command queue 328, and transmitted to the non-volatile memory 150 (Step S504). After the collection read operation commands are transmitted to the non-volatile memory 150, the encoded read data corresponding to the collection read operation commands are transmitted from the non-volatile memory 150 to the control circuit 320 (Step S506).

After the ECC circuit 124 of the control circuit 320 performs a decoding operation on each encoded read data, a decoded content is generated. Moreover, a first count of the decoded content is transmitted to a first register of the register set (Step S508). In the example of FIG. 4, the decoded content contains the error bit count. The error bit count is transmitted to the accumulator resistor 330a.

After all encoded read data are decoded, the value stored in the first register is a first parameter and the first parameter is inputted into a prediction function of the function storage circuit (Step S510). In the example of FIG. 4, the value recorded in the accumulator resistor 330a is the total error bit count of the specified block after the error bit counts of all decoded contents are transmitted to the accumulator resistor 330a. Then, the value of the accumulator resistor 330a is read by the control circuit 320 and used as a parameter of the prediction function. The parameter is inputted into the prediction function.

From the above descriptions, the control circuit 320 of the solid state storage device 300 does not need to retain a specified space in the buffer 130 to temporarily store the decoded contents. Moreover, the control circuit 320 can acquire the parameter of the prediction function without the need of reading and calculating the decoded contents in the buffer 130. Consequently, the performance of the solid state storage device 300 is largely enhanced.

In the above embodiment, the error bit count is the parameter. It is noted that the example of the parameter is not restricted. According to the same register control method, the read operation command further contains a register selection field. Consequently, various parameters are collected by plural registers of the register set 330.

Figure 6:
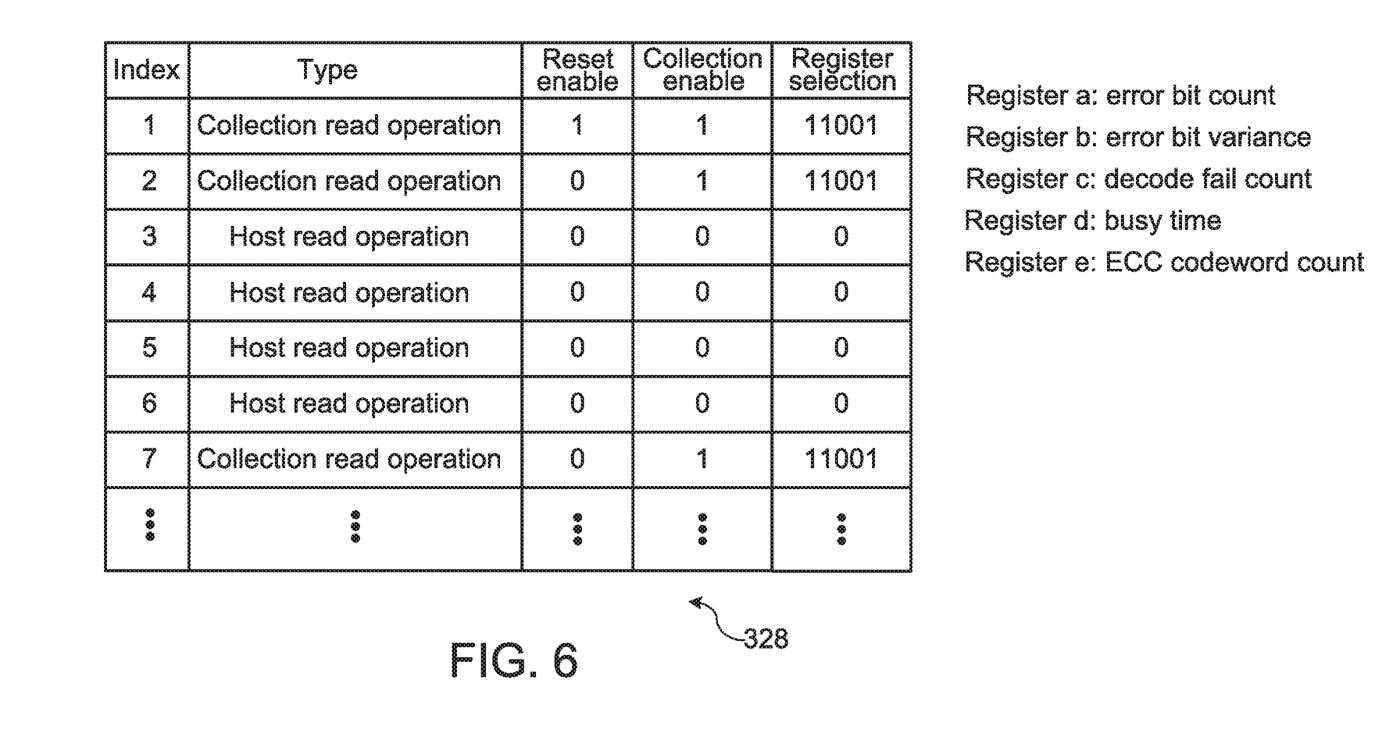
FIG. 6 schematically illustrates the operating relationship between the read operation commands in the command queue and the register of the control circuit according to a second embodiment of the present invention.

FIG. 6 schematically illustrates the operating relationship between the read operation commands in the command queue and the register of the control circuit according to a second embodiment of the present invention. As shown in FIG. 6, the read operation command generated by the control circuit 320 contains seven bits. One bit denote a reset enabling field, another bit denotes a collection enabling field, and the other five bits denote a register selection field for selecting a specified register of the register set 330.

For example, the register set 330 comprises at least five registers. These register can calculate different parameters according to the decoded contents. Please refer to FIG. 6. The register "a" is used for calculating the error bit count. The register "b" is used for calculating the error bit variance. The register "c" is used for calculating the decode fail count. The register "d" is used for calculating the busy time. The register "e" is used for calculating the ECC codeword count.

For example, if the parameters to be inputted into the prediction function by the control circuit contain the error bit count, the error bit variance and the ECC codeword count, the register selection field in the read operation command is set as "11001" by the control circuit 320. That is, the registers "a", "b" and "e" are enabled, but the registers "c" and "d" are disabled. The detailed procedures will be described as follows.

In the collection read operation command corresponding to the index 1, the reset enabling field is "1", the collection enabling field is "1", and the register selection field is "11001". Consequently, the registers "a", "b" and "e" are enabled. Under this circumstance, the registers "a", "b" and "e" are reset, and the error bit count, the error bit variance and the ECC codeword count are started to be collected. According to the decoded content, the error bit count, the error bit variance and the ECC codeword count are transmitted from the control circuit 320 to the registers "a", "b" and "e", respectively.

In the collection read operation command corresponding to the index 2, the reset enabling field is "0", the collection enabling field is "1", and the register selection field is "11001". Consequently, the error bit count, the error bit variance and the ECC codeword count will be continuously collected by the registers "a", "b" and "e", respectively.

In the host read operation command corresponding to the index 3, the index 4, the index 5 and the index 6, the reset enabling field is "0", the collection enabling field is "0", and the register selection field is "00000". Consequently, the error bit count, the error bit variance and the ECC codeword count are not collected by the registers "a", "b" and "e", respectively.

In the collection read operation command corresponding to the index 7, the reset enabling field is "0", the collection enabling field is "1", and the register selection field is "11001". Consequently, the error bit count, the error bit variance and the ECC codeword count will be continuously collected by the registers "a", "b" and "e", respectively.

The rest may be deduced by analogy. After the 4096 collection read operation commands generated by the control circuit 320 are transmitted from the command queue 328 to the non-volatile memory 150, the values in the registers "a", "b" and "e" are the error bit count, the error bit variance and the ECC codeword count, respectively. Meanwhile, the values of the registers "a", "b" and "e" are directly read by the control circuit 320 and used as three parameters to be inputted into the prediction function.

In the second embodiment, plural registers are used for receiving the corresponding values of the decoded contents, e.g., the error bit count, the error bit variance and the ECC codeword count. Consequently, the plural parameters for the prediction program are acquired.

Figure 7:
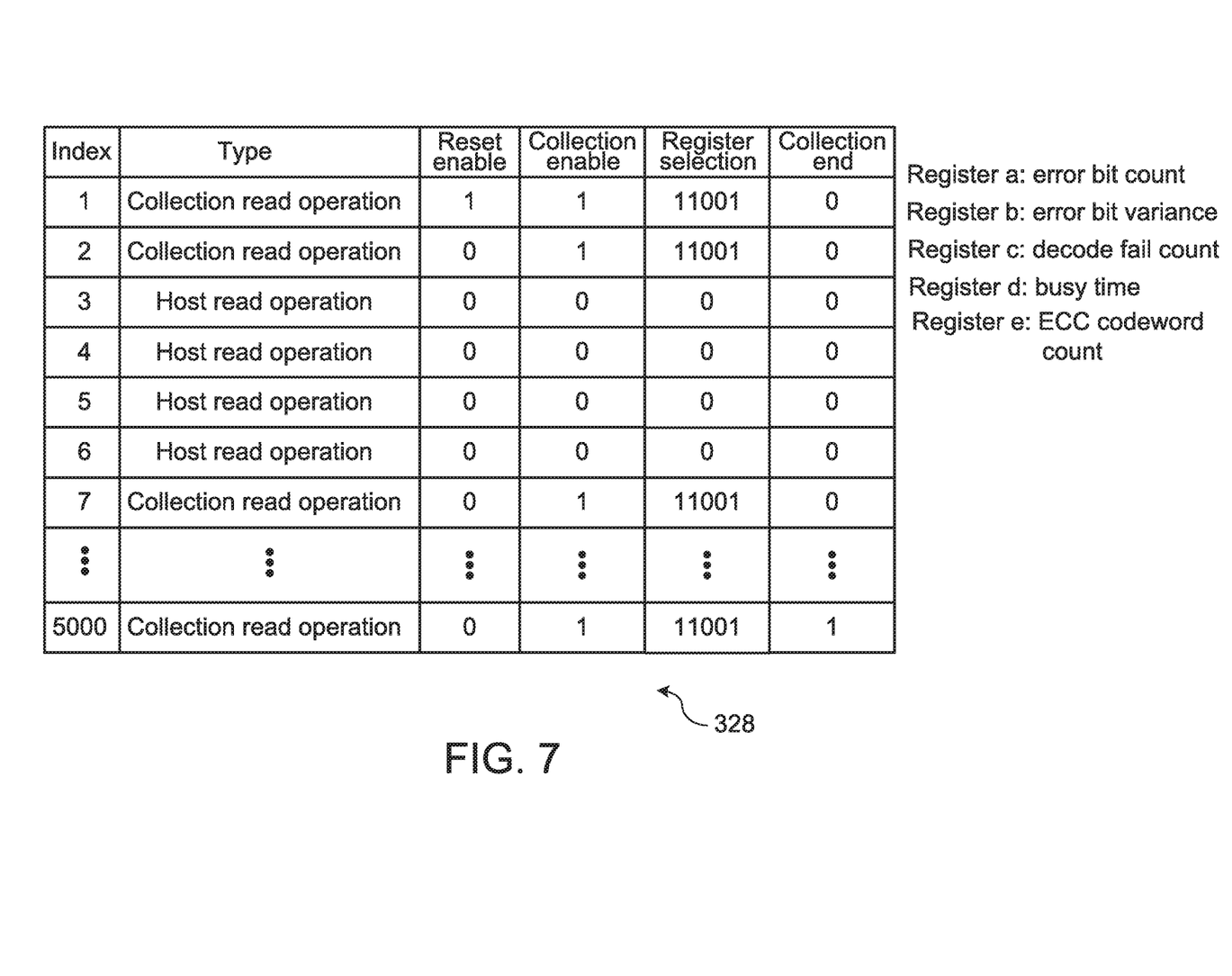
FIG. 7 schematically illustrates the operating relationship between the read operation commands in the command queue and the register of the control circuit according to a third embodiment of the present invention.

It is noted that numerous modifications and alterations may be made while retaining the teachings of the invention. FIG. 7 schematically illustrates the operating relationship between the read operation commands in the command queue and the register of the control circuit according to a third embodiment of the present invention. In comparison with the second embodiment, the read operation command of this embodiment further comprises an additional bit. As shown in FIG. 7, the last bit of the read operation command denotes a collection end field. If the collection end field is "1", the collection read operation command is the last collection read operation command. If the collection end field is "0", the collection read operation command is not the last collection read operation command.

For collecting the error bit count of one block, the control circuit 320 has to issue 4096 (=1024×4) collection read operation commands to the command queue 328. For example, the last collection read operation command corresponds to the index 5000 of the command queue 328. In the collection read operation command corresponding to the index 5000, the collection end field is "1". In the collection read operation commands corresponding to the indexes 1-4999, the collection end field is "0".

When the collection read operation command corresponding to the collection end field "1" is transmitted to the non-volatile memory 150, the control circuit 320 is notified that 4096 collection read operation commands have been transmitted to the command queue 328. The values in the registers "a", "b" and "e" are the error bit count, the error bit variance and the ECC codeword count, respectively. Meanwhile, the values of the registers "a", "b" and "e" are directly read by the control circuit 320 and used as three parameters to be inputted into the prediction function.

According to the same register control method, the read operation command further contains a group selection field. Consequently, various parameters of a specified die are collected by a specified register group of the register set 330.

Figure 8:
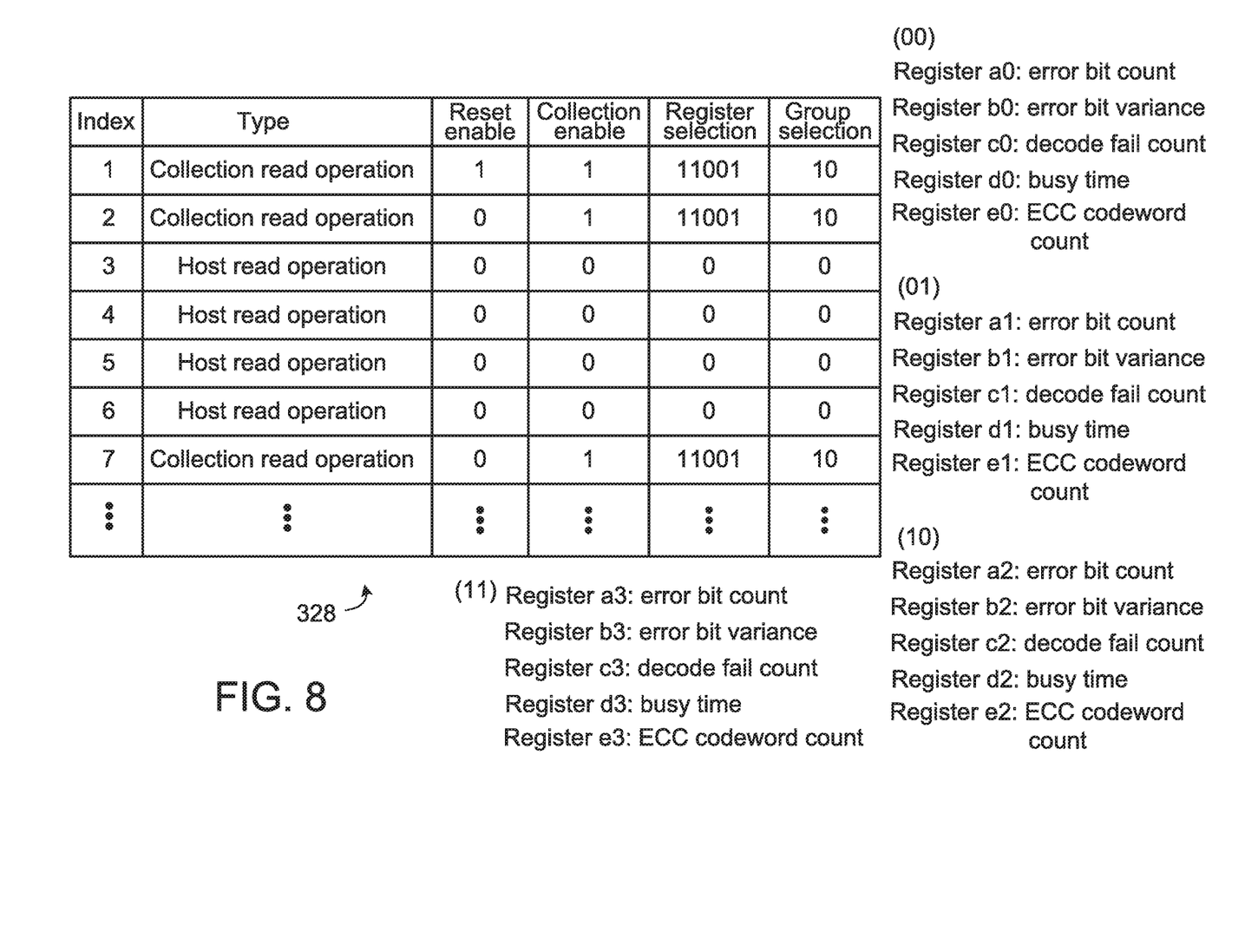
FIG. 8 schematically illustrates the operating relationship between the read operation commands in the command queue and the register of the control circuit according to a fourth embodiment of the present invention.

FIG. 8 schematically illustrates the operating relationship between the read operation commands in the command queue and the register of the control circuit according to a fourth embodiment of the present invention. As shown in FIG. 8, the read operation command generated by the control circuit 320 contains nine bits. One bit denote a reset enabling field, another bit denotes a collection enabling field, five bits denote a register selection field, and the other two bits denote a specified register group field of the register set 330.

For example, the register set 330 comprises twenty registers. These twenty registers are classified into four register groups. That is, each register group contains five registers. Please refer to FIG. 8. The register group (00) contains the registers a0, b0, c0, d0 and e0. The register group (01) contains the registers a1, b1, c1, d1 and e1. The register group (10) contains the registers a2, b2, c2, d2 and e2. The register group (11) contains the registers a3, b3, c3, d3 and e3.

The registers a0, a1, a2 and a3 are used for calculating the error bit count. The registers b0, b1, b2 and b3 are used for calculating the error bit variance. The registers c0, c1, c2 and c3 are used for calculating the decode fail count. The registers d0, d1, d2 and d3 are used for calculating the busy time. The registers e, e1, e2 and e3 are used for calculating the ECC codeword count.

In this embodiment, the control circuit 320 uses different register groups to calculate the parameters of different dies. For example, the register group (00) is used for collecting the parameters of the die 11, and the register group (11) is used for collecting the parameters of the die 12. The rest may be deduced by analogy.

For example, the control circuit 320 selects the register group (10) to collect the error bit count, the error bit variance and the ECC codeword count of a specified block of a specified die. Consequently, the control circuit 320 sets the register selection field in the read operation command as "11001" and sets the register group field as "10". That is, the registers a2, b2 and e2 in the register group (10) are enabled, but the registers c2 and d2 in the register group (10) are disabled.

In the collection read operation commands corresponding to the index 1, the index 2 and the index 7, the collection enabling field is "1" and the register selection field is "11001". According to the decoded content, the error bit count, the error bit variance and the ECC codeword count are transmitted from the control circuit 320 to the registers a2, b2 and e2, respectively.

In the host read operation command corresponding to the index 3, the index 4, the index 5 and the index 6, the error bit count, the error bit variance and the ECC codeword count are not collected by the registers a2, b2 and e2, respectively.

The rest may be deduced by analogy. After the 4096 collection read operation commands generated by the control circuit 320 are transmitted from the command queue 328 to the non-volatile memory 150, the values in the registers a2, b2 and e2 are the error bit count, the error bit variance and the ECC codeword count, respectively. Meanwhile, the values of the registers a2, b2 and e2 are directly read by the control circuit 320 and used as three parameters to be inputted into the prediction function.

From the above descriptions, the control circuit 320 of the solid state storage device 300 does not need to retain a specified space in the buffer 130 to temporarily store the decoded contents. Moreover, the control circuit 320 can acquire the parameter of the prediction function without the need of reading and calculating the decoded contents in the buffer 130. Consequently, the performance of the solid state storage device 300 is largely enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
   a non-volatile memory comprising plural dies;
   a buffer; and;
   a control circuit connected with the non-volatile memory and the buffer, and comprising an error correction circuit, a function storage circuit, a register set and a command queue,
   wherein plural collection read operation commands are generated by the control circuit, temporarily stored in the command queue, and transmitted to the non-volatile memory, wherein according to each of the collection read operation commands, the non-volatile memory generates a corresponding encoded read data to the control circuit,
   wherein after the error correction circuit performs a decoding operation on a first encoded read data corresponding to a first collection read operation command, a first decoded content is generated and a first count of a first parameter of the first decoded content is transmitted to a first accumulator register of the register set,
   wherein after all the encoded read data is decoded by the error correction circuit and each count of the first parameter of the decoded contents is transmitted to the first accumulator register, a value accumulated by the first accumulator register is inputted into a prediction function of the function storage circuit.

2. The solid state storage device as claimed in claim 1, wherein the collection read operation command contains a reset enabling field and a collection enabling field, wherein when the reset enabling field is enabled, the first accumulator register is reset, wherein when the collection enabling field is enabled, the count of the first parameter of the decoded content is inputted into the first accumulator register.

3. The solid state storage device as claimed in claim 1, wherein the first parameter is one of an error bit count, an error bit variance, a decode fail count, a busy time, an ECC codeword count, a program time, an erase time, a current decoding process, an operating temperature of the non-volatile memory and a read voltage shift.

4. The solid state storage device as claimed in claim 3, wherein the collection read operation command further contains a register selection field for selecting the first accumulator register and a second accumulator register of the register set.

5. The solid state storage device as claimed in claim 4, wherein after the error correction circuit performs the decoding operation on the first encoded read data and the first decoded content is generated, the first count of the first parameter of the first decoded content is transmitted to the first accumulator register and a second count of a second parameter of the first decoded content is transmitted to the second accumulator register.

6. The solid state storage device as claimed in claim 3, wherein the collection read operation command further contains a group selection field for selecting the first accumulator register and a second accumulator register of a first register group of the register set.

7. The solid state storage device as claimed in claim 6, wherein after the error correction circuit performs the decoding operation on the first encoded read data and the first decoded content is generated, the first count of the first parameter of the first decoded content is transmitted to the first accumulator register and a second count of a second parameter of the first decoded content is transmitted to the second accumulator register.

8. The solid state storage device as claimed in claim 1, wherein the collection read operation command further contains a collection end field, wherein the collection end field of the last collection read operation command of the plural collection read operation commands is set as a first state, wherein after the last collection read operation command is transmitted to the non-volatile memory, the control circuit is notified that the plural collection read operation commands are transmitted to the command queue and the value accumulated by the first accumulator register is inputted into the prediction function of the function storage circuit.

9. The solid state storage device as claimed in claim 8, wherein the collection end field of the plural collection read operation commands is set as a second state except the last collection read operation command.

10. The solid state storage device as claimed in claim 6, wherein the first register group of the register set is used for collecting the parameters of a first die and a second register group of the register set is used for collecting the parameters of a second die.

11. The solid state storage device as claimed in claim 1, wherein the plural collection read operation commands are generated by the control circuit after a specified time period.

* * * * *